United States Patent [19]

Shintani et al.

[11] Patent Number: 5,479,873
[45] Date of Patent: Jan. 2, 1996

[54] METHOD OF MANUFACTURING ALUMINUM BORATE WHISKERS HAVING A REFORMED SURFACE BASED UPON GAMMA ALUMINA

[75] Inventors: Yoshitomo Shintani, Susono; Tetsuya Suganuma, Nagoya; Shuitsu Matsuo, Atsugi; Hajime Saito, Nissin; Hidenori Yamaoka, Odawara; Nobuhisa Kurono, Aichi; Hiroaki Kotaka, Nagoya, all of Japan

[73] Assignees: Toyota Jidosha Kabushiki Kaisha, Toyota; Toshiba Ceramics Co., Ltd., Hadano, both of Japan

[21] Appl. No.: 388,451

[22] Filed: Feb. 14, 1995

[30]  Foreign Application Priority Data

Feb. 14, 1994  [JP]  Japan .................................. 6-039107

[51] Int. Cl.$^6$ .................................................. C30B 29/62
[52] U.S. Cl. ........................... 117/75; 117/1; 117/87
[58] Field of Search ..................... 117/1, 75, 87, 117/922, 950, 953

[56]  References Cited

U.S. PATENT DOCUMENTS 3,011,870  12/1961  Webb et al. ........................ 117/75
4,985,222  2/1991  Hata et al. ........................ 117/75

FOREIGN PATENT DOCUMENTS

| 5-9620 | 1/1993 | Japan . |
| 5-33081 | 2/1993 | Japan . |
| 5-117098 | 5/1993 | Japan . |
| 5-139899 | 6/1993 | Japan . |
| 5139899 | 6/1993 | Japan ........................ 117/75 |

*Primary Examiner*—R. Bruce Breneman
*Assistant Examiner*—FeLisa Garrett
*Attorney, Agent, or Firm*—Oblon, Spivak, McClelland, Maier & Neustadt

[57]  ABSTRACT

Aluminium borate whiskers by which a composite material having a higher strength than ever is available by definitely suppressing a generation of spinel along the surface of the whiskers are prepared by heating aluminium borate whiskers bearing a r-alumina surface layer in an atmosphere of ammonia gas or ammonia gas and a hydrocarbon gas such that a layer of a nitro-oxide and oxide of aluminium is generated along the surface of the whiskers.

3 Claims, 4 Drawing Sheets 5,479,873

METHOD OF MANUFACTURING ALUMINUM BORATE WHISKERS HAVING A REFORMED SURFACE BASED UPON GAMMA ALUMINA

BACKGROUND OF THE INVENTION

1. Field of the invention

The present invention relates to aluminium borate whiskers and a preform thereof, and more particularly to a method of manufacturing aluminium borate whiskers and a preform thereof having a reformed surface based upon a gamma alumina layer generated during the manufacture of the aluminium borate whiskers.

2. Description of the Prior Art

Aluminium borate whiskers have a composition generally expressed by $Al_{18}B_4O_{33}$ and are superior in strength, elasticity, heat resistibility and anti-chemical resistance, thereby providing a superior reinforcing material for a composite material. Nevertheless, aluminium borate whiskers are available at very low cost, so that an aluminium base composite material reinforced by aluminium borate whiskers is available at much lower cost than a composite material reinforced by, for example, SiC whiskers.

The aluminium borate whiskers generally have a uniform r-alumina (gamma alumina) layer covering the surface thereof just as they have been manufactured, and the r-alumina layer is removed before the whiskers are delivered as a product, as the r-almuina is thermally and chemically unstable. In this regard, it was proposed in Japanese Patent Laid-open Publication 5-139899 to heat the aluminium borate whiskers bearing a uniform r-alumina layer remained thereon so that the r-alumina layer is converted into a layer of α-alumina (alpha alumina) which is stable at high temperature.

However, in a composite material having an aluminium alloy matrix reinforced by the aluminium borate whiskers, a reaction

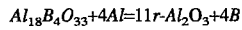
$$Al_{18}B_4O_{33}+4Al=11r\text{-}Al_2O_3+4B$$

occurs, and since B is less reactive with oxygen than Mg, there further occurs a reaction

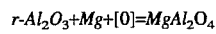
$$r\text{-}Al_2O_3+Mg+[O]=MgAl_2O_4$$

whereby a layer of spinel ($MgAl_2O_4$) is generated along the surface of the whiskers, thereby decreasing the amount of Mg in the matrix, while the strength of the whiskers lowers, deteriorating the strength of the composite material.

Various attempts have been made to obviate the above-mentioned problem caused by the generation of the spinel, including an improvement of the composition of the matrix metal or a reforming of the surface layer of the whiskers.

However, it was noted that, even when the aluminium borate whiskers have been treated according to the method of the abovementioned publication, when the aluminium borate whiskers are heated to 800°–1200° C. in the atmosphere during a manufacture of a composite material in which an aluminium alloy containing Mg is reinforced by the aluminium borate whiskers, the spinel is still generated along the surface of the whiskers, showing that the effect of suppressing the generation of the spinel is not yet sufficient.

SUMMARY OF THE INVENTION

The inventors of the present application had carried out various experimental researches to further improve the performance of the aluminium borate whiskers, and found that it is possible to definitely suppress the spinel to generate along the surface of the aluminium borate whiskers during a manufacture of a composite material in which a matrix of an aluminium alloy containing Mg is reinforced by aluminium borate whiskers if the aluminium borate whiskers bearing a r-alumina surface layer are heated beforehand to a temperature of a certain range in a particular gas atmosphere.

Therefore, it is the object of the present invention to provide, based upon the knowledge obtained from the results of the experimental researches, a method of manufacturing aluminium borate whiskers which can provide a composite material having a higher strength than ever by definitely suppressing the generation of spinel along the surface of the whiskers.

According to the present invention, the above-mentioned object is accomplished by a method of manufacturing aluminium borate whiskers having a reformed surface, comprising the step of heating aluminium borate whiskers having a surface layer of r-alumina in an atmosphere of ammonia gas such that a nitro-oxide and oxide layer of aluminium is formed along the surface of the whiskers. The atmosphere may desirably contain a hydrocarbon.

The formation of the nitro-oxide and oxide layer of aluminium along the surface of the whiskers may be carried out in a condition that the whiskers having a surface layer of r-alumina are arranged in a preform, and the preform is heated in an atmosphere of ammonia gas or ammonia gas and a hydrocarbon gas such that a nitro-oxide and oxide layer of aluminium is formed along the surface of the whiskers arranged to provide the preform.

According the present invention, by the aluminium borate whiskers having a surface layer of r-alumina being heated in an atmosphere of ammonia gas or ammonia gas and a hydrocarbon gas to a relatively high temperature such as 1000°–1500° C., there is generated along the surface of the whiskers a layer of a nitro-oxide and an oxide of aluminium which is very stable against reaction with Mg, so that when the whiskers thus processed are mixed with a matrix metal of an aluminium alloy containing Mg molten at a high temperature for the manufacture of a composite material thereof, the generation of spinel is definitely avoided.

Although the structure of the nitro-oxide and oxide layer of aluminium (referred to as "ALO layer" hereinbelow) is not very clear, the material is guessed to be a reaction product of $Al_2O_3$ and N which according to the X-ray diffraction analysis, a highest intensity peak at a distance between crystal lattice planes of approximately 2.73 (2.71–2.75), a second or third intensity peak at a value of the distance of approximately 2.44 (2.42–2.46) and a third or second intensity peak at a value of the distance of approximately 2.83 (2.81–2.85), and having a phase similar to $\theta\text{-}Al_2O_3$.

When the atmosphere further contains a hydrocarbon gas with ammonia gas, the hydrocarbon gas functions to expedite the nitriding reaction by removing the steam generated as a result of the reduction of ammonia gas. According to the results of the experimental researches carried out by the inventors, it is desirable that the volumetric ratio of ammonia gas versus a hydrocarbon gas is 200:1–2:1.

Further, according to the results of the experimental researches carried out by the inventors, although the ALO layer is effective at any thickness in suppressing the generation of spinel along the surface of aluminium borate whiskers, the effect is distinguished when the mean thickness of the ALO layer is not less than 10 nm, and more particularly distinguished when the mean thickness thereof is not less than 20 nm. However, when the mean thickness of the ALO layer exceeds 250 nm, particularly 300 nm, the effect of the ALO layer in suppressing the generation of spinel is no more substantially increased, while on the other hand the quality of the whiskers themselves deteriorates, together with a substantial increase of the manufacturing cost. Therefore, according to the present invention, the ALO layer should desirably be generated to have 10–300 nm, particularly 20–250 nm mean thickness.

The ALO layer formed along the surface of aluminium borate whiskers according to the method of the present invention sometimes contains very fine α alumina particles compositely distributed therein. The ALO layer having such a composition also definitely suppresses the generation of spinel. The ALO layer of this kind should also desirably be formed to have 10–300 nm, particularly 20–250 nm mean thickness in the same manner as the ALO layer containing no such very fine α alumina.

Further, the aluminium borate whiskers manufactured according to the method of the present invention sometimes have a layer principally made of AlN formed outside of the ALO layer formed along the surface of the whiskers. The ALO layer having such an outer layer also suppresses the generation of the spinel. In such a multi-layered construction the layer principally made of AlN should desirably be not thicker than 100 nm, more desirably 50 nm, by mean thickness.

According to the present invention, the aluminium borate whiskers may be used for manufacturing a whisker reinforced composite material with the r-alumina surface layer generated in the production process of the whiskers maintained without being removed, and therefore high performance aluminium borate whiskers free from the generation of spinel are available at lower cost than by the method of removing the r-alumina layer and forming thereafter an AlN layer along the surface of the whiskers.

BRIEF DESCRIPTION OF THE DRAWINGS

In the accompanying drawings.

DESCRIPTION OF THE PREFERRED EMBODIMENTS

In the following the present invention will be described in more detail with respect to some preferred embodiments thereof with reference to the accompanying drawings.

EMBODIMENT 1

Figure 1:
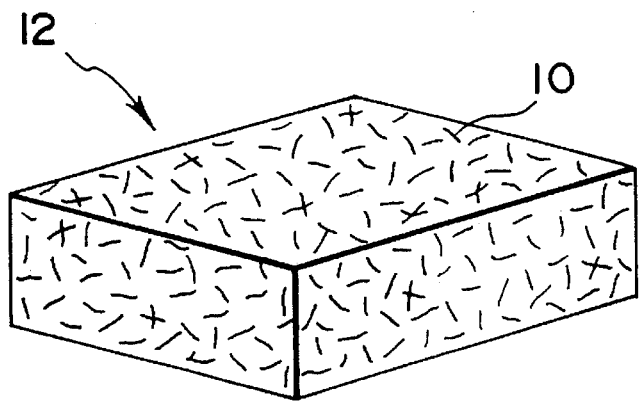
FIG. 1 is an illustration of a preform prepared according to the method of manufacturing aluminium borate whiskers or a preform thereof according to the present invention.
Figure 2:
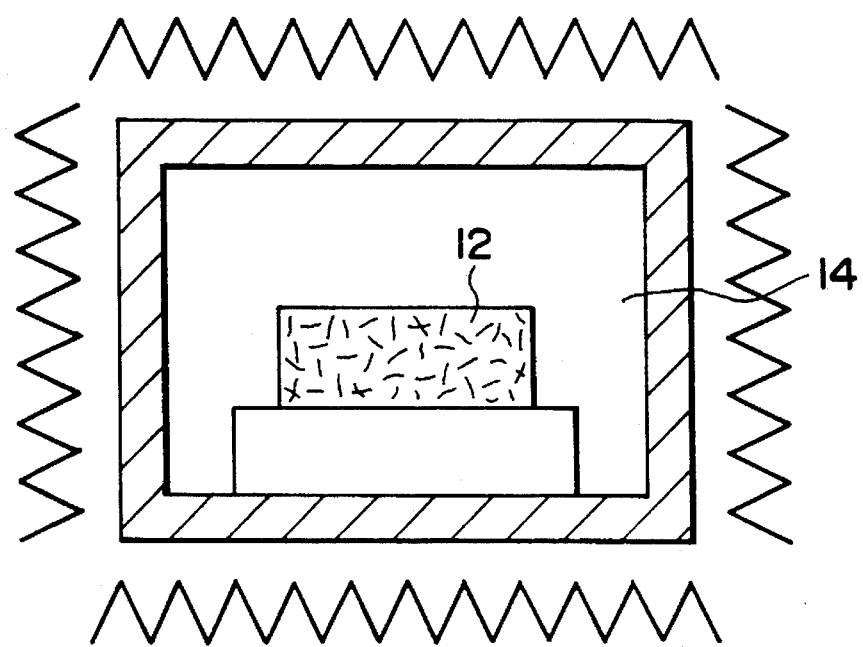
FIG. 2 is an illustration of a process of heating the preform shown in FIG. 1 in a particular atmosphere.

First, as shown in FIG. 1, aluminium borate whiskers 10, manufactured by Shikoku Chemical Industries Co., Ltd., having 0.5–1 μm diameter and 10–30 μm length, were arranged to provide a 40 g preform 12 of random orientations having a rectangular parallelpiped shape of 100×100×15 mm, without particularly removing the r-alumina surface layer. Then, as shown in FIG. 2, the preform 12 was heated to 1300C° C. for 3 hours in an atmosphere of ammonia gas 14.

Figure 3:
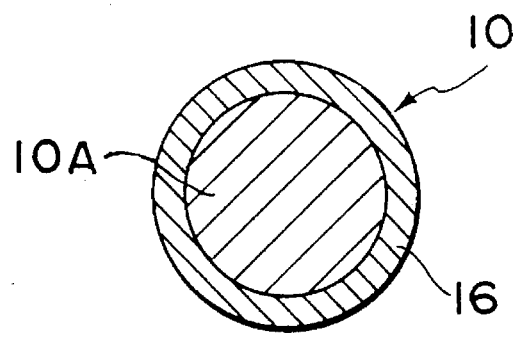
FIG. 3 is a diagrammatical illustration showing a cross section of the aluminium borate whisker having an ALO layer along the surface thereof.

FIG. 3 shows schematically a cross section of the aluminium borate whisker 10 having a 0.1 μm ALO layer 16 generated along the surface thereof as a result of the above-mentioned processing. 10A is a part made of substantially only aluminium borate. The border between the ALO layer 16 and the substantially aluminium borate portion is actually not so distinct as illustrated in the figure.

Figure 4:
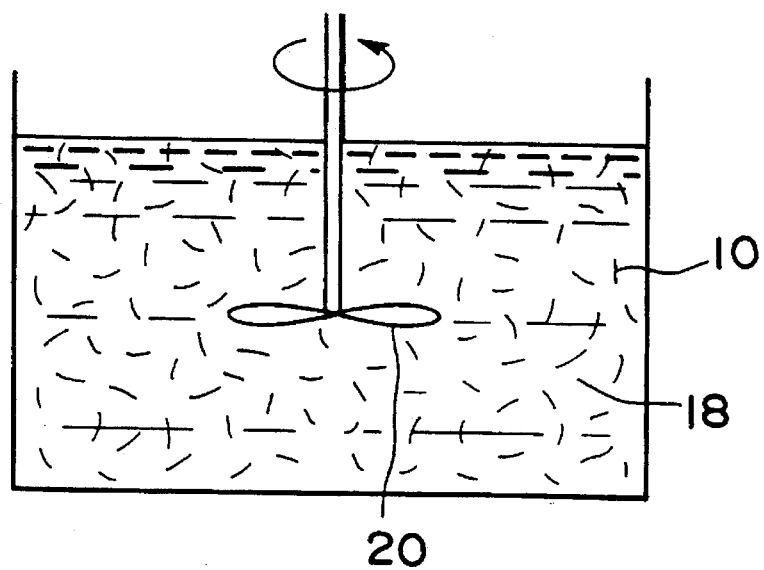
FIG. 4 is a diagrammatical illustration showing a disassembling process of the aluminium borate whiskers.

Then, as shown in FIG. 4, the aluminium borate whiskers covered with the ALO layer were put into a bath of distiled water 18 and were sufficiently disassembled under an agitation of the distiled water and the whiskers by a propeller 20, and thereafter the whiskers were formed into a preform having three dimensions of 100×38×16 mm by a shaping tool, and then the preform was put into a refrigerator together with the shaping tool to be maintained at −50° C. until the water contained in the preform was completely frozen.

Figure 5:
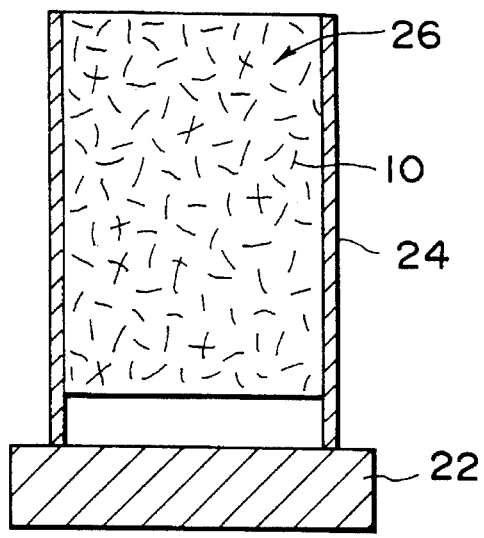
FIG. 5 is a longitudinal section of a case and a preform of the aluminium borate whiskers charged therein.

Then the preform was removed from the shaping tool, and then, as shown in FIG. 5, the preform 26 was charged into a case 24 made of a stainless steel (JIS SUS304) having an inside space of a 38×16 mm cross section and a 140 mm length and including an integral weight portion 22. Then, the preform was heated together with the case such that the preform was completely dried. The preform thus prepared had the aluminium borate whiskers having the ALO layers generated along the surface thereof randomly oriented at a volumetric ratio of 30%.

Figure 6:
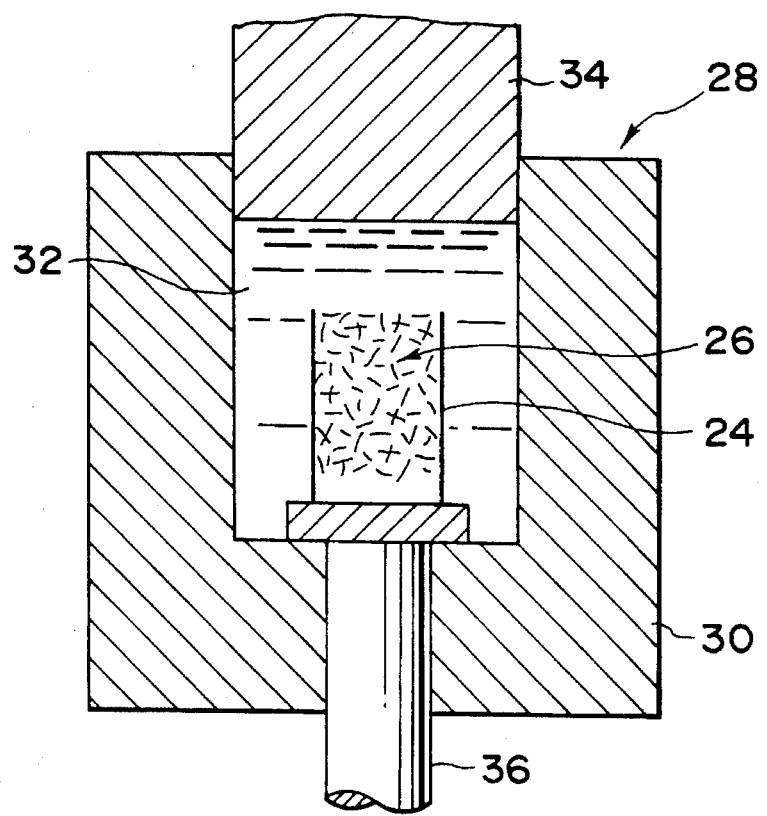
FIG. 6 is a diagrammatical illustration showing the process of molding a composite material with the preform of the aluminium borate whiskers shown in FIG. 5 by a high pressure casting device.

Then, the preform 26 was preheated to 600° C. for one hour, and thereafter, as shown in FIG. 6, the preform, together with the case 24, was placed on the bottom of a casting mold 30 of a high pressure casting device 28, then a molten aluminium alloy (JIS 2024) at a temperature of 800° C. was poured into the casting mold, and then the molten aluminium alloy was pressurized by a plunger 34 to a pressure of approximately 1000 kgf/cm$^2$ the pressure having been maintained until the molten metal completely solidified. Thereafter, the solidified body was taken out from the casting mold 30 by a knockout pin 36, and a block of composite material formed of the aluminium alloy reinforced with the aluminium borate whiskers having the ALO surface layer was produced by machining, and the block of the composite material was processed by heat treatment T6.

For the purpose of comparison, aluminium borate whiskers, manufactured by Shikoku Chemical Industries Co., Ltd., having 0.5-μm diameter and 10–30 μm length, and prepared as a commercial product by the r-alumina surface layer having been removed, were processed in the same manner and according to the same conditions as in Example 1, whereby an AlN layer was generated along the surface of the whiskers, providing Comparison 1-1, and by using these whiskers a composite materials was produced in the same manner and according to the same conditions as in Embodiment 1. The composite material thus obtained was also processed by the T6 heat treatment.

Further, two more samples for comparison were prepared, by using aluminium borate whiskers having the r-alumina surface layer remained without being removed, providing Comparison 1-2, and by using aluminium borate whiskers removed of the r-alumina surface layer to be a commercial product, providing Comparison 1-3, respectively, also in the same manner and according to the same conditions as in Embodiment 1, and the composite materials thus produced were also processed by the T6 heat treatment.

Bending test pieces were produced from the blocks of the respective composite materials, and the respective test pieces were tested by the three point bending test with a distance between the support points of 40 mm and at a temperature of 180° C. The test results are shown in the following Table 1. From Table 1 it will be noted that the strength of the composite material is substantially improved by forming the ALO layer along the surface of the aluminium borate whiskers. For information, the reason why the strength of Comparison 1-1 remains at the same level as Comparisons 1-2 and 1-3 is guessed to be due to a deterioration of the whiskers themselves caused by a too thick generation of AlN layer.

TABLE 1

| | Whisker Processing | Bending Strength (MPa) |
|---|---|---|
| Embodiment 1 | the present invention | 756 |
| Comparison 1-1 | AlN generation | 650 |
| Comparison 1-2 | no processing | 620 |
| Comparison 1-3 | no processing | 620 |

With respect to the composite materials reinforced by the aluminium borate whiskers processed according to Embodiment 1 and Comparison 1-2, a border area between the matrix metal and the whiskers was inspected by the TEM method and was examined by the X-ray diffraction analysis. The results of the inspection by the TEM method of those composite materials are shown in FIGS. 7 and 8, respectively.

Figure 7:
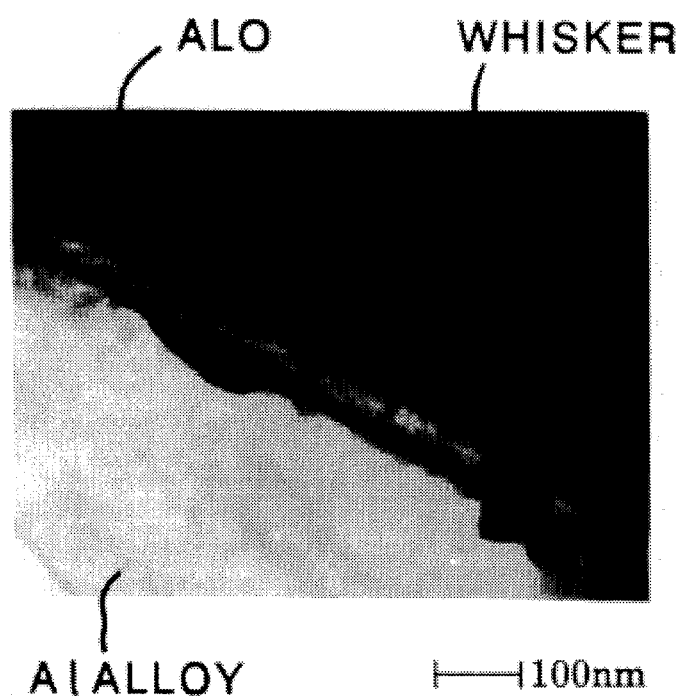
FIG. 7 is a TEM photograph showing the metal structure around the border of the aluminium borate whiskers and the matrix metal in the composite material manufactured according to Embodiment 1.

As will be noted from FIG. 7, in the composite material according to Example 1, there exists an ALO layer having a thickness of about 150 nm along the surface of the whisker. The ALO layer was analyzed qualitatively, and as a result, no peak of Mg was detected. By the X-ray diffraction analysis, it was confirmed that the ALO layer includes a phase similar to $\theta$-$Al_2O_3$ and $\alpha$-$Al_2O_3$. Further, there existed a layer of a thickness of about 50 nm along the surface of the ALO layer. This surface layer was analyzed qualitatively, and as a result, peaks were detected with respect to Al, Mg and O. However, by the X-ray diffraction analysis no spinel was detected, while a peak of AlN was detected. Since the same surface layer is seen when the matrix metal is pure aluminium, said surface layer is considered to be an AlN layer.

Figure 8:
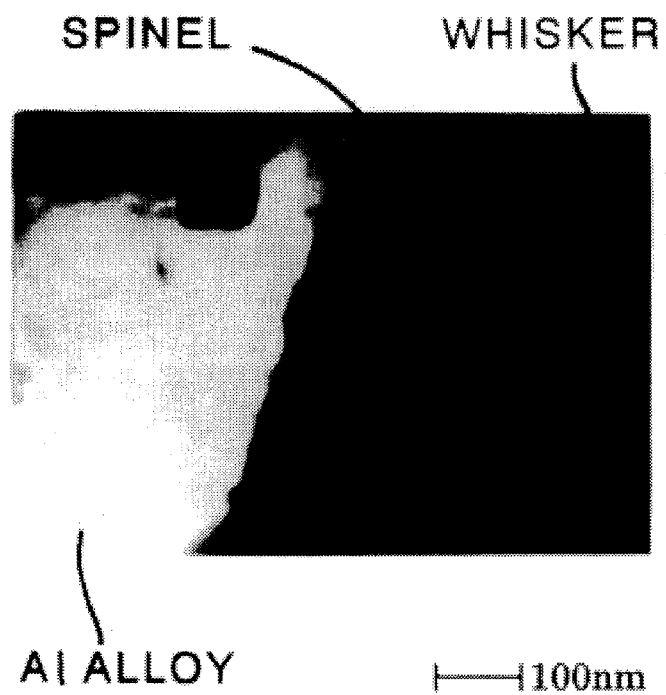
FIG. 8 is a TEM photograph showing the metal structure around the border of the aluminium borate whiskers and the matrix metal in the composite material manufactured according to Comparison 1-2.

In contrast, in the composite material of Comparison 1-2, as shown in FIG. 8, there exists a reaction layer having a thickness of about 150–200 nm along the border between the whisker and the aluminium alloy matrix. As a result of qualitative analysis of this reaction layer, peaks of Al, Mg and O were detected, and it was confirmed by the X-ray diffraction analysis that the reaction layer is a spinel layer.

It was confirmed that, when the ammonia gas atmosphere in the above embodiment is replaced by a mixture of ammonia gas and a hydrocarbon gas (20:1 by volume), the same results are available.

EMBODIMENT 2

Aluminium borate whiskers, manufactured by Shikoku Chemical Industries Co., Ltd., having 0.5–1 μm diameter and 10–30 μm length, with the r-alumina surface layer maintained without being removed, were arranged to a preform of 100×38×16 mm, including the whiskers in random orientations at a volumetric ratio of 25%, and the preform of the whiskers was heated to 1400° C. in an atmosphere of a mixture of ammonia gas and a hydrocarbon gas (20:1 by volumetric ratio) for one hour.

For the purpose of comparison, aluminium borate whiskers, manufactured by Shikoku Chemical Industries Co., Ltd., having 0.5–1 μm diameter and 10–30 μm length, with the r-alumina surface layer maintained without being removed, were arranged to a preform of 100×38×16 mm, including the whiskers in random orientations at a volumetric ratio of 25%, and the preform was heated to 1400° C. in the natural atmosphere for one hour, to be Comparison 2.

Then, the surface layers of the aluminium borate whiskers of Embodiment 2 and Comparison 2 were examined by the X-ray diffraction analysis. The results are shown in the following Table 2. In this connection, although not shown in Table 2, the peak value of the ALO layer was higher than those of $\alpha$-$Al_2O_3$ and AlN in Embodiment 2, and the ratio of the peak value of $\alpha$-$Al_2O_3$ to those of $Al_{18}B_4O_{33}$ and $\alpha$-$Al_2O_3$ was higher in Comparison 2 than in Embodiment 2.

TABLE 2

| | | Composite Material | |
|---|---|---|---|
| | Whisker | Main Comp. | Sub Comp. |
| Embodiment 2 | ALO, $\alpha$-$Al_2O_3$ AlN, $Al_{18}B_4O_{33}$ | ALO $Al_{18}B_4O_{33}$ | $\alpha$-$Al_2O_3$ |
| Comparison 2 | $\alpha$-$Al_2O_3$ $Al_{18}B_4O_{33}$ | $Al_{18}B_4O_{33}$ | $MgAl_2O_4$ $\alpha$-$Al_2O_3$ |

In the same manner and according to the same conditions as in Embodiment 1, except that the matrix metal was an aluminium alloy (Al-4wt % Cu-3wt % Mg) poured at 750° C., composite materials were produced by using the respective whiskers and processed by the T6 heat treatment, and the surface layers of the respective composite materials were examined by the X-ray diffraction analysis. Further, bending test pieces were produced from the respective composite materials and tested by the three point bending method in the same manner as in Embodiment 1 at room temperature as well as 180° C. The results of the X-ray diffraction analysis are shown in the above Table 2, and the results of the bending test are shown in the following Table 3.

TABLE 3

| | Whisker Processing | Bending Strength (MPa) | |
| --- | --- | --- | --- |
| | | Room Temp. | 180° C. |
| Embodiment 2 | the present invention | 773 | 763 |
| Comparison 2 | α-Al₂O₃ processing | 732 | 609 |

From Table 3, it will be noted that in Comparison 2 where no ALO layer was generated along the surface of the whiskers, the spinel was generated along the surface of the whiskers forming the composite material, whereas in Embodiment 2 where an ALO layer was generated along the surface of the whiskers, no spinel was generated along the surface of the whiskers forming the composite material. Therefore, it will be noted that the ALO layer is effective in suppressing the generation of spinel.

Further, from Table 3 it will be noted that even when the matrix is an aluminium alloy having a composition different from that of the aluminium alloy of Embodiment 1, the strength of the composite material, particularly the high temperature strength thereof, can be greatly improved by generating an ALO layer along the surface of the aluminium borate whiskers.

It was confirmed that, when the atmosphere of the mixture of ammonia gas and a hydrocarbon gas in the above embodiment is replaced by an atmosphere of ammonia gas, the same results are available.

EMBODIMENT 3

By using the same aluminium borate whiskers processed in the same manner and according to the same conditions as in the above-mentioned Embodiment 2 and Comparison 2, composite materials were manufactured in the same manner and according to the same conditions as in the above-mentioned Embodiment 1, except that the matrix metal was a magnesium alloy (JIS AZ91) poured at 700° C. The respective composite materials were then processed by the T6 heat treatment. Bending test pieces were made from the respective composite materials and tested according to the three point bending method in the same manner and according to the same conditions as in Embodiment 1.

As a result, it was noted that the composite material manufactured by using the whiskers of the embodiment shows a high strength such as 400 MPa, whereas the composite material manufactured by using the whiskers of the comparison shows a low strength such as 250 MPa. Therefore, it is noted that even when the matrix is a magnesium alloy, the strength of the composite material can be greatly improved by generating an ALO layer along the surface of the aluminium borate whiskers.

Experiments for Confirmation

Aluminium borate whiskers, manufactured by Shikoku Chemical Industries Co., Ltd., having 0.5–2 μm diameter and 10–40 μm length, bearing the r-alumina surface layer remained without being removed, were arranged to produce a wider variety of preforms each having a shape of 100× 38×16 mm including the whiskers in random orientations at a volumetric ratio of 25–50%, and these preforms were respectively processed according to various conditions which are alternative combinations of an atmosphere selected from ammonia gas, a mixture of ammonia gas and a hydrocarbon gas at a volumetric ration of 20:1, natural atmosphere, nitrogen, and hydrogen, and a heating temperature in a range of 900°–1600° C., each having been heated for 3 hours.

By using the respective whiskers thus differently processed, composite materials were manufactured in the same manner and according to the same conditions as in Embodiment 1, except that the matrix metal was an aluminium alloy consisting of 97 wt % Al and 3 wt % Mg poured at 850 ° C. The border areas between the whiskers and the matrix metal of the respective composite materials were examined by the X-ray diffraction analysis to inspect occurrence of the spinel generating reaction. As the results, it was confirmed that the generation of the ALO layer along the surface of the aluminium borate whiskers is available only when the aluminium borate whiskers bearing the r-alumina surface layer are heated in an atmosphere of ammonia gas or a mixture of ammonia gas and a hydrocarbon gas, but not available in the natural atmosphere, nitrogen, and hydrogen. Further, it was noted that when the atmosphere is a mixture of ammonia gas and a hydrocarbon gas, AlN is also generated together with ALO or ALO and α-Al₂O₃ along the surface of the whiskers.

Although the present invention has been described in detail with respect to several particular embodiments thereof in the above, it will be apparent for those skilled in the art that the present invention is not limited to those particular embodiments and other various embodiments are possible within the scope of the present invention.

We claim:

1. A method of manufacturing aluminium borate whiskers having a reformed surface, comprising the step of heating aluminium borate whiskers having a surface layer of r-alumina in an atmosphere of ammonia gas such that a nitro-oxide and oxide layer of aluminium is formed along the surface of the whiskers.

2. A method according to claim 1, wherein the atmosphere further contains a hydrocarbon.

3. A method according to claim 1, wherein the aluminium borate whiskers are arranged to a preform before being heated in the atmosphere.

* * * * *